(12) United States Patent
Sorokov et al.

(10) Patent No.: US 6,423,191 B1
(45) Date of Patent: Jul. 23, 2002

(54) SPUTTERING METHOD AND APPARATUS FOR DEPOSITING A COATING ONTO SUBSTRATE

(75) Inventors: Boris Sorokov; Ilya Khanukov, both of Haifa (IL)

(73) Assignee: Thin Films, Ltd. (IL)

( * ) Notice: Subject to any disclaimer, the term of this patent is extended or adjusted under 35 U.S.C. 154(b) by 0 days.

(21) Appl. No.: 08/388,425

(22) Filed: Feb. 14, 1995

(30) Foreign Application Priority Data

Feb. 17, 1994 (IL) .................................................. 108677

(51) Int. Cl.[7] ............................................. C23C 14/34
(52) U.S. Cl. ........................... 204/192.12; 204/192.22; 204/192.23; 204/192.26; 204/298.16
(58) Field of Search ..................... 204/192.12, 192.13, 204/192.22, 192.23, 192.26, 192.16, 192.15, 298.16, 298.14

(56) References Cited

U.S. PATENT DOCUMENTS

| | | | | |
|---|---|---|---|---|
| 3,616,450 A | * | 10/1971 | Clark | 204/192.12 |
| 3,669,860 A | * | 6/1972 | Knowles et al. | 204/192.12 |
| 3,988,232 A | | 10/1976 | Wasa et al. | 204/192.18 |
| 4,046,660 A | * | 9/1977 | Fraser | 204/298.16 |
| 4,094,764 A | * | 6/1978 | Boucher et al. | 204/298.07 |
| 4,865,712 A | * | 9/1989 | Mintz | 204/298.16 |
| 5,167,789 A | * | 12/1992 | Latz | 204/192.12 |
| 5,169,509 A | * | 12/1992 | Latz et al. | 204/192.13 |
| 5,234,560 A | * | 8/1993 | Kadlec et al. | 204/192.12 |

OTHER PUBLICATIONS

International Search Report.

* cited by examiner

Primary Examiner—Rodney G. McDonald
(74) Attorney, Agent, or Firm—Blank Rome Comisky & McCauley LLP

(57) ABSTRACT

Sputtering method and apparatus for depositing a coating onto substrate employs variable magnetic field arranged in vicinity of a cathode within a working chamber, filled with ionizable fluid. By controlling a magnetic field topology, i.e. orientation and value of magnetic strength with respect to cathode there is enabled localization and shifting of plasma away from substrate and by thus improvement of adhesion and properties of deposited coatings.

13 Claims, 5 Drawing Sheets

SPUTTERING METHOD AND APPARATUS FOR DEPOSITING A COATING ONTO SUBSTRATE

FIELD OF THE INVENTION

The present invention relates to the coating of substrates by means of physical sputtering effect, in which the transfer of kinetic energy from ions of glow discharge plasma, striking the cathode surface leads to ejection of cathode material from the cathode and to subsequent formation of coating onto the substrate.

More particularly, the invention relates to sputtering process carried out in a diode-type apparatus, where glow discharge is established in the working chamber in an atmosphere of ionizable fluid, maintained at reduced pressure between the cathode, constituting a target, and the anode and where cathode atoms, emitted by the bombardment of plasma ions move towards the substrate, mounted in the same chamber.

The present invention also refers to articles, provided with the coating, deposited by the sputtering method.

BACKGROUND OF THE INVENTION

The occurrence of a metallic coating which sputtered on the glass walls of a discharge tube was observed in the last century; the explanation for this phenomena at the beginning of this century, is the ejection of cathode material by positive ions striking the cathode.

Nowadays the sputtering process, which basically can be attributed to the same phenomena, is used on an industrial scale for the deposition of different kinds of coatings on different substrates. A large variety of devices has been developed for this purpose.

A comprehensive review of the physical methods of discharge sputtering deposition as well of equipment configuration, used for this purpose can be found in the monograph "Thin film processes", edited by John L. Vossen and W. Kern, Academic Press, 1978.

The simplest system, which is employed for deposition of films by sputtering process utilizes the glow discharge between two electrodes (cathode and anode), established within the evacuated working chamber and is commonly referred to as a diode arrangement.

The cathode in these systems is usually planar and constitutes the target, connected to a negative voltage source, capable of supplying voltage of several kV (dc or ac), while the anode is grounded. The substrate holder is mounted within the chamber and faces the cathode.

A stream of gas (the most common sputtering gas is argon) is continuously introduced into the chamber and is evacuated therefrom so as to provide a medium in which a glow discharge plasma, consisting of a gas ions, can be maintained.

The applied negative voltage urges these ions to strike the cathode, while removing its atoms by momentum transfer. The flux of these atoms moves towards the substrate, usually situated in the vicinity of the glow discharge region and condense onto the substrate surface.

In some cases gases or mixtures of gases other than argon are fed into the chamber so as to cause the deposition of a compound, synthesized on the substrate due to interaction between the atoms, which are dislodged from the cathode plate, and the reactive gas species, which are present in the chamber atmosphere.

$TiO_2$, synthesized by sputtering a Ti cathode in a reactive atmosphere of mixture of argon with oxygen, can be mentioned as an example of such a compound.

The main advantage, associated with the planar diode arrangement is its simplicity and possibility of applying rather high voltages to the cathode, resulting in ejection and sputtering of atoms with high energies in the range of 10–100 eV, which reach the-substrate fast and thereon form a coating layer, firmly adhering to the substrate surface.

On the other hand, the high energy of plasma particles reaching the substrate is inevitably associated with exposing of the substrate surface to a heat flux with high density (up to several watt per square centimeter) and heating the substrate up to rather high temperatures of 400–600 deg.C.

Such high temperatures might have number of undesirable consequences, e.g.,

- preclude the use of sputtering deposition for coating substrates, made of materials, susceptible to these temperatures e.g. plastics,
- cause warping in substrates with a large length-to-thickness ratio,
- deteriorate adhesion between the coating and the substrate due to the development of excessive thermal stresses in the interface region, because of the difference in linear thermal expansion coefficients of the coating and the substrate,
- promote undesirable chemical reactions at the substrate surface, which is exposed to plasma ions and electrons, and the subsequent formation of undesirable compounds.

The other disadvantage of the planar diode arrangement is associated with relatively high gas pressure, which should be kept within the diode source chamber, so as to maintain condition for self-sustained glow discharge. This pressure might affect dispelling of the stream of the target atoms (so-called collision scattering), moving towards the substrate, which in its turn reduces the sputtering rate and prevents the establishing of conditions for formation of homogeneous coating and might even cause deterioration of some properties of the coating.

Reducing of the pressure can, to some extent, decrease the above-mentioned associated negative effects; however, this pressure can not be kept less than a certain minimum, which is 20–100 millibars; otherwise, the density of ions required for sputtering of target atoms falls too rapidly and sputtering rate becomes too slow.

Typical sputtering conditions, employed in planar high voltage diode sources, e.g., for sputtering of Ni in Ar atmosphere, as described in the above monograph are: cathode-to-substrate separation 4,5 cm, voltage 3 kV, pressure 75 millibar (7,5 KPa), current density 1 $mA/cm^2$.

It is known that in order to improve sputtering rates at low pressures the ionization efficiency of available ionizing electrons of the gas should be increased. This effect is provided in diode sources, known as magnetrons, in which a transverse magnetic field, normal to the electric field is applied to the target and is so configured that the ExB electron drift currents close on themselves.

The magnetron mode of operation is defined by magnetic focusing of the glow discharge, which results in the formation of an uniform plasma sheet over the cathode, disposed remotely from the substrate surface and thus preventing its excessive heating, seeing that the substrate is no longer subject to the plasma bombardment.

A typical diode source, operating in the magnetron mode is disclosed, e.g., in U.S. Pat. No. 4,006,073, and comprises a cathode target, made of the sputtering material, a substrate holder mounted opposite said target, at least one anode, the means for supplying an ionizable gas, the means for establishing an electric field between the cathode and anode, sufficient to sustain an electrical discharge between them through said gas and means for establishing a magnetic field to extend through the space surrounding said anode and cathode.

Despite the benefits inherent to the magnetron mode of operation, like relatively low temperatures at the substrate surface (in the range of 50–200 deg.C.) and elimination of collision scattering effect due to reduced pressure, this configuration nevertheless suffers from its intrinsic limitations.

Configuration of magnetic field, formed as a closed-on-itself loop, causes a nonlinear current characteristic of the glow discharge area and does not the allow applyication of voltage as high as in planar diode sources.

The typical magnetron-mode operating conditions for magnetron type diode sources, as listed in the above mentioned monograph are:

voltage 800 V, magnetic field 150 G, pressure 1 millibar (100 Pa), current density 20 mA/cm$^2$.

The relatively low voltage, employed in magnetron sources is associated with reduced energy, submitted to atoms being ejected from the target and moving to the substrate with energies of several eV instead of several tenths of eV. Reduced energy of target material flux, reaching the substrate is associated with formation of less dense coating and poor adhesion to the substrate.

A further serious disadvantage of the magnetron configuration is associated with reduced service life of the target due to inhomogeneous dislodging of cathode material and formation of regions with deep cathode erosion (local erosion profile), where magnetic and electrical field are crossed. Besides shortening the service life these regions together with less eroded regions define the target topography, which prevent the possibility of achieving a homogenous flux of material ejected from the target surface. The thickness of the coating becomes nonuniform and depends on the disposition of the substrate with respect to target surface.

OBJECT OF THE INVENTION

The object of the present invention is to provide a sputtering deposition method and apparatus for its implementation, as well article of manufacture, comprising substrate and coating, deposited by this method in said apparatus, in which the above mentioned drawbacks of planar diode and magnetron diode modes of operation are sufficiently reduced or overcome, without losing, however, the benefits associated with each of these configurations.

In particular, the first object of the present invention is to provide new, simple and improved sputtering deposition method and apparatus, in which plasma is shifted away from the substrate and the substrate surface is not exposed to heat flux with high density so as not to undergo heating over 200–300 deg.C.

The second object of the present invention is to provide a new and improved sputtering deposition method and apparatus, in which the pressure of gas, supplied to the chamber does not exceed 1–7 millibars (0.1–0.7) Pa, being sufficient, however, for maintaining a self-sustained glow discharge and deposition with high sputtering rate.

The third object of the present invention is to provide a sputtering deposition method and apparatus, in which relatively high voltage of several kV can be applied to the cathode, while employing a magnetic field for focusing and localization of the glow discharge area.

Another object of the present invention is to provide a sputtering deposition method and apparatus, in which formation of local erosion profile through the target surface is sufficiently reduced, so as to improve the target service life, to achieve homogeneous ejection of target material and formation of uniform coating on the substrate, irrespective of mutual disposition of the substrate and the target.

Still another object of the present invention is to provide a sputtering deposition method and apparatus, as well as articles of manufacture, consisting of substrate and a coating firmly adhered thereon and having improved structure properties.

Yet another object of the present invention is to provide a mold for the manufacture of molded optical articles, consisting of glass substrate and silica coating, deposited by sputtering deposition method and apparatus, in which said coating has improved density, chemical resistance and optical properties.

The above and other objects and advantages of the present invention can be achieved in accordance with the following combination of its essential features, referring to embodiments of the present invention as a method, apparatus for its implementation and article of manufacture, produced in the apparatus for carrying out the method.

The method of depositing a coating onto a substrate by means of a sputtering process wherein a glow discharge plasma is generated in diode sputtering source between a cathode, provided with outwardly facing surface, constituting a target, and an anode, and wherein establishing of said plasma results in ion bombardment of said target, followed by ejection of target material and its movement towards said substrate with subsequent formation of a coating, depositing onto said substrate, whereas said method comprises the following steps:

introducing a to-be-coated substrate, into the process chamber so as to expose the surface of said substrate to the flux of the sputtered target material, establishing a magnetic field within said chamber, applying to said cathode electrical power sufficient for establishing a glow discharge plasma, establishing within said chamber an atmosphere of ionizable fluid, continuously fed therein and evacuated therefrom so as to establish a working pressure, sufficient for maintaining the glow discharge plasma, consisting of ions of said fluid, maintaining between said anode and cathode, a self-sustained glow discharge accompanied by generation of plasma, consisting of ions, bombarding said target and emitting target material towards said substrate, characterized in that, said magnetic field being varied so as to achieve topology of its magnetic lines, defined by magnetic strength vector arbitrary oriented with respect to said anode and defined by magnetic strength in the range of 10–100 kA/m within the region, situated adjacent to said anode and in the range of at least 8–10 kA/m adjacent to said target and within a region, having the configuration of a layer, extending above the outwardly facing target surface, said layer having a thickness in the range of 2–5 cm; and said magnetic field being varied so as to localize and shift said plasma substantially away from said substrate.

In accordance with one of the preferred embodiments of the method, electrical power is supplied by means of dc or ac supply, being capable of supplying to said diode source voltage in the range of 1–5 kV, said magnetic field being established by means of solenoids or permanent magnets.

According to a further preferred embodiment said ionizable fluid is continuously fed within said chamber so as to monitor therein a working pressure in concert with variations in electrical power and/or magnetic field.

As per still another preferred embodiment said ionizable fluid consists of an inert and/or reactive gas.

According to another preferred embodiment said working pressure of said ionizable fluid is maintained at less than 1 Pa, preferably in the range of 0.1–0.7 Pa.

In accordance with a further embodiment of the present invention, there is provided an apparatus suitable for depositing a coating onto the substrate by means of a diode sputtering source wherein a glow discharge plasma is generated between cathode, constituting a target, and anode, and wherein establishing of said plasma results in ion bombardment of said target, followed by liberation of target material and its ejection and transport towards said substrate with subsequent formation of a coating, depositing onto said substrate, said apparatus substantially consisting of:

- a vacuum chamber containing an atmosphere of ionizable fluid fed within said chamber at a controlled reduced pressure
- a cathode pole structure, positioned within said chamber and defined by an outwardly facing surface, constituting a target, composed of material to be ejected therefrom,
- an anode, insulated electrically from said cathode pole structure and situated within said chamber so as to provide diode arrangement with said cathode pole structure,
- an electric power supply means for applying electrical potential between said target and said anode, abd sufficient for establishing and maintaining a self sustained plasma glow discharge between them,
- at least one substrate holding means, mounted within said chamber and positioned so as to expose said substrate to the flux of target material ejected therefrom,
- a means for supplying ionizable fluid into said chamber and its evacuation therefrom so as to maintain within said chamber the atmosphere of said fluid at pressure sufficient for maintaining said plasma glow discharge,
- a magnetic field generating means for establishing magnetic field within said chamber,
- an appropriate control and instrumentation means for monitoring electrical and magnetic parameters of said power supply means and said magnetic field generating means, characterized in that said magnetic field generating means is situated substantially adjacent to said anode and is capable of generating a magnetic field with topology defined by magnetic strength vector arbitrary oriented with respect to said anode and having magnetic strength gradient within the interior of said chamber, said magnetic strength preferably being in the range of 10–100 kA/m in the vicinity of said anode and in the range of at least 8–10 kA/m in the vicinity of said cathode within a region, extending above the target surface and having a thickness of 2–5 cm.

According to one of the preferred embodiments of the present invention, implementing it as an apparatus suitable for carrying out of said method, said electrical power supply means is a dc supply, being capable of supplying to said diode voltage in the range of 1–5 kV, said magnetic field generating means being formed as solenoids or permanent magnets.

In still another preferred embodiment said apparatus comprises a pressure control means adapted to monitor pressure within said chamber in accordance with variation of parameters of said electrical power supply and/or magnetic field generating means.

As per yet a further preferred embodiment, the material of said target consists of a metallic element and said ionizable fluid is a mixture of argon and oxygen.

According to still another preferred embodiment said outwardly facing target surface of said cathode pole structure is formed as a body, defined by central symmetry with respect to its center of symmetry; said anode is formed as a body, having rotational symmetry with respect to its central axis of symmetry; said anode surrounds said cathode pole structure; said substrate holding means is formed as a body, having central symmetry with respect to its center of symmetry; said substrate holding means is provided with a plurality of holding stations arranged thereon for fixation of a plurality of substrates; said cathode pole structure, said anode and said substrate holding means being arranged in such a manner, that both said centers of symmetry of said target surface and said substrate holding means and said central axis of symmetry of said anode substantially coincide.

In a further preferred embodiment said cathode pole structure is formed as a spherical segment and said substrate holding means being formed as a truncated icosahedron.

According to another preferred embodiment of the present invention it can be implemented in an article, manufactured within said apparatus by carrying out of said method, said article of manufacture consisting of a substrate and a coating deposited onto said substrate, whereas said coating is formed on the surface of said substrate due to interaction of material, sputtered from the cathode target with the ionized reactive fluid, fed into said source; wherein sputtering of said material towards said substrate is effected by glow discharge plasma magnetically shifted away from said substrate and said coating, deposited onto said substrate being formed at temperatures not exceeding 300 deg.C., preferably 40–200 deg.C.

In still a further preferred embodiment said coated article constitutes a mold for manufacturing of optical articles, said substrate consisting of glass and said coating consisting of $SiO_2$ film.

The present invention in its various embodiments has only been summarized briefly.

For better understanding of the present invention as well of its advantages, reference will be now made to the following description of its embodiments, taken in combination with accompanying drawings, tables and examples.

DETAILED DESCRIPTION OF SPECIFIC EMBODIMENTS

Figure 1:
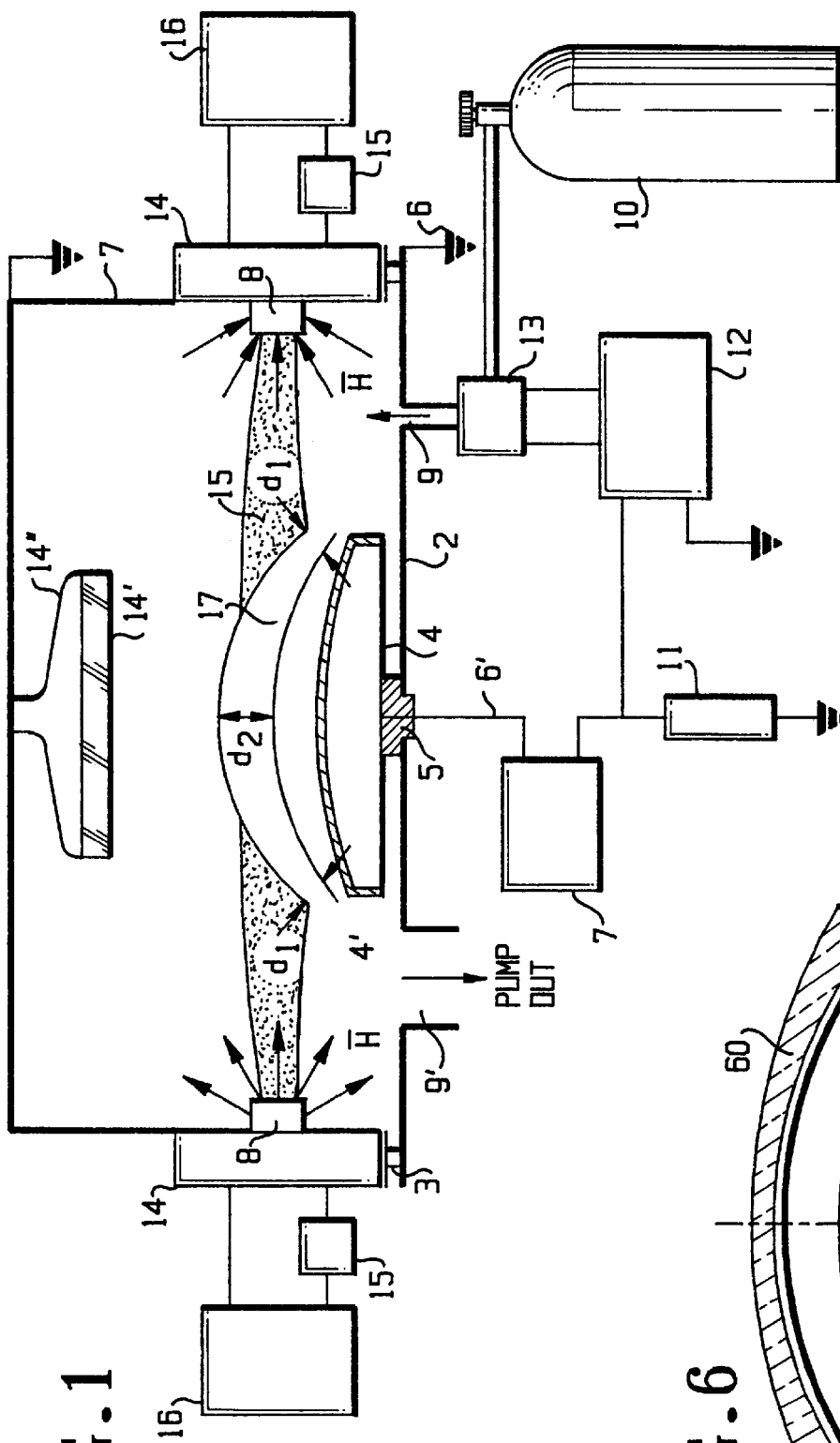
FIG. 1 shows schematically an apparatus for sputtering deposition according to the present invention.

With reference to FIG. 1, a sputtering assembly, suitable for implementation of sputtering deposition method according to present invention comprises a working chamber 1, resting on a platform or base 2 and insulated therefrom by vacuum tight sealing 3. Cathode pole structure 4 is mounted within the chamber on the pedestal 5, made of electrically insulating material so as to insulate the cathode from the chamber. The housing is wired to the ground 6 and cathode pole structure is connected by line 6' to power supply unit 7, capable of supplying negative voltage in the range of several kilo volts.

Annular anode 8 is preferably arranged within the chamber so as to provide for a distance of at least 2 cm from cathode and to provide for appropriate electrical conditions, sufficient for generating of glow discharge in the area between cathode and anode after the chamber is evacuated and degassed and electrical power is supplied to the cathode.

It should be understood that instead of annular anode a pair or several planar anodes can be employed as well.

There are provided an inlet port 9, connected with the source 10 of appropriate ionizable gas to be introduced into the chamber, and an outlet port 9' for pumping out and evacuation of the gas therefrom by appropriate pumping means (not shown). Simultaneous supply of gas and its evacuation enable maintenance of the gas atmosphere within the chamber at certain pressure sufficient for establishing a self-sustaining glow discharge between cathode and anode, and the generation of plasma, consisting of positive gas ions.

The magnitude of current, developed during generation of plasma, is continuously sensed and measured by appropriate current sensing means 11, which is connected with power supply unit 7 and with cathode current regulating unit 12, enabling control of supplied voltage so as to maintain conditions for self-sustained glow discharge. The amount of gas, supplied from source 10 is supervised by control valve 13, connected to the same regulating unit 12 so as to control amount of gas to enter in accordance with fluctuations of electrical parameters within the chamber.

Immediately after establishing of glow discharge in the area between cathode and anode the positive plasma ions are attracted by negative potential, supplied to cathode pole structure and continuously bombard its outwardly facing surface 4', constituting a target. Atoms of target material, dislodged therefrom by striking ions are accelerated by momentum transfer up to energies of 10–100 ev and are sputtered toward oppositely situated substrate 14', mounted on the substrate holding means 14" arranged within the chamber. The substrate surface is exposed to atoms, which sputtered from the cathode and formed a coating which is deposited on it.

The composition of the coating forming on the substrate depends on the composition of target material and of the gas atmosphere within the chamber, seeing that the sputtered target atoms, moving toward the substrate may interact with the gas ions and form compounds, depositing on the substrate, rather then a coating consisting of target atoms themselves.

In accordance with the present invention the gas atmosphere within the chamber and target composition might be chosen so as to provide conditions for deposition of both atomic or compound coating; it has been empirically found that this invention is particularly advantageous for the sputtering of compound coatings of oxide type, e.g., Silica, Alumina, $SnO_2$, $Ta_2O_5$.

For this purpose the reactive gas, consisting of a mixture of inert gas with oxygen is fed within the chamber and the target material is chosen so as to contain suitable metallic element, e.g. Si, Al, Sn, Ta, etc.

It should be understood, however, that the present invention is not limited by deposition of oxides and that by proper selection of reactive gas atmosphere (e.g. nitrogen, ammonia, acetilen, etc.) and composition of the target material, the coating, consisting of non oxide compounds (nitrides, carbides, borides, silicides, etc.) can be deposited as well.

As can be seen in FIG. 1 the outwardly facing target surface 4', is defined by a curvilinear convex shape; however, this shape can be defined by a concave or concave/convex curvilinear configuration, planar configuration, etc.

The target can be formed integrally with the cathode structure or constitute a layer of foil, plate or deposit, supported by this structure.

It is not shown in detail, but it should be understood that the appropriate means for cooling of cathode structure and/or substrate holding means might be provided, so as to improve dissipation of the heat generated during the sputtering process. The high voltage power supply unit, suitable for employment in the present invention can be any type known in the art as being sufficient for glow discharge sputtering, e.g., DC supply, low-frequency AC supply or RF supply.

The assembly is provided with a magnetic field generating means 14, arranged substantially in proximity with anode 8, so as to establish magnetic field within the chamber, schematically shown by dotted area 15. The magnetic field generating means 14, shown in FIG. 1 is formed as a system of solenoids with windings, connected with current control means 15,15' for adjusting magnetic field by variation of current, supplied by current supplies 16,16'. It should be understood, however, that permanent magnets, having suitable magnetic parameters can be employed as well for generation of magnetic field. In contrast to conventional magnetron diode sources, which are also provided with magnetic field generating means and where magnetic field is configured with respect to the cathode surface so as to trap electron currents by closing them on themselves, the magnetic field 15 in accordance with the present invention is configured and maintained in such a manner, that its vector of magnetic strength is arbitrarily oriented with respect to anode 8, as shown by arrows H. By virtue of this configuration the electron currents in plasma are not closed on themselves anymore; thus, there is enabled a magnetic focusing of the plasma within the localized region, which can be deliberately shifted away from the substrate holding means. By virtue of this configuration of magnetic field and by proper selection of magnetic strength, as it will be further explained in more details, heating of the substrate is eliminated, or at least is sufficiently reduced, as compared to known sputtering sources.

In order to achieve the most optimal condition for focusing of plasma the magnetic parameters of the magnetic field generating means 14 are varied so as to achieve a nonuniform magnetic field, defined by variable magnetic strength within the chamber. In accordance with the present invention the magnetic strength gradient should be established within the chamber in such a manner that magnetic strength in the range of 10–100 kA/m is within the area, situated in the vicinity of said anode and in the range of at least 8–10 kA/m within the area, situated in vicinity of said cathode pole structure. It has been empirically found that it is especially advantageous, if the region of magnetic strength of 8–10 kA/m is concentrated within the cathode glow area and the best results are achieved if parameters of magnetic field generating means are chosen so as to configure the cathode glow area as a layer, substantially similar to that of outwardly facing target surface and having a thickness of 2–5 cm.

With reference to FIG. 1 the cathode glow area 17 is shown, in which the magnetic strength is kept in the range of 8–10 kA/m and as can be seen this area is defined by a layer with a saddle-like shape, configured similarly to the outwardly facing target surface 4'.

The thickness of this layer varies from a minimum value d1 of approximately 2 cm at lateral portions to a maximum d2 of approximately 5 cm in the middle. It should be understood, however, that proper selection of magnetic parameters, satisfying described above condition of magnetic strength gradient, might result in the cathode glow area being configured differently so as to correspond with the target surface of a different shape.

It is shown in FIG. 1 that the magnetic field generating means 14 are situated adjacent to anode 8 and outside the working chamber 1. It should be understood, however, that these means can be arranged within the chamber as well.

It has been empirically revealed, that by applying the magnetic field to the diode source in accordance with the above described conditions, the self-sustaining discharge between cathode and anode can be reliably maintained at sufficiently reduced pressure, compared to that used in conventional planar anode sources.

In particular, it has been shown that, if the applied voltage is in the range of 2–5 kV and the reactive gas atmosphere within the chamber is a mixture of argon with oxygen, the pressure of reactive gas, sufficient for generating of plasma and sputtering of target material should be less than 1 Pa, preferably 0.1–0.7 Pa. This pressure is significantly less than that required in conventional high voltage planar diode sources. For maintaining of gas atmosphere within the chamber at such a pressure the reactive gas is continuously fed from source 10 through valve 13 and is simultaneously pumped out via port 9'. As has already been mentioned the coordinated operation of valve 13 and pumping means is ensured by control unit 12 in accordance with electrical parameters of the glow discharge, establishing in the source.

The combination of high voltage with relatively low reactive gas pressure enables efficient sputtering, seeing that scattering collision effect becomes less significant. The energy submitted to sputtered atoms in a high voltage source will be spent more extensively for coating formation and adhesion. At the same time provision of magnetic focusing of plasma and its shifting away from the substrate prevents its overheating which could have taken place in a high voltage sputtering process.

It has been practically established that the substrate temperature reached during deposition of oxide coatings in the sputtering apparatus according to the present invention, did not exceed 200 deg.C., compared to 400–600 deg.C. associated with conventional high voltage diode sources.

The invention will now be described herein in the following non-limiting example 1.

EXAMPLE 1

The substrate 14' is mounted on the substrate holding means so as to face the target surface 4' and to be spaced therefrom by a distance 5–20 cm.

The chamber 1 is sealed; its interior is evacuated up to pressure 0.001–0.004 Pa.

The current supply 16 is initiated and parameters of magnetic field are adjusted by means of a control means 15, so as to create a magnetic strength gradient, sufficient for localization of plasma within a region, separated by a distance of 3–15 cm from the substrate 14'.

The power supply 7 is initiated and a potential of 2–5 kV, negative with respect to grounded chamber 1 is supplied to the cathode pole structure 4.

By means of current sensor 11 the value of discharge current is adjusted and the stream of reactive gas mixture is fed into the chamber from the source 10, up to building working pressure, sufficient for maintaining of self-sustained glow discharge. Particular parameters suitable for deposition of Al2O3 coating on stainless steel substrate were:

Supplied negative voltage: 3 kV

Discharge current: 300 mA

Working pressure of gas atmosphere: 0.15 Pa (0,0015 mbar)

Reactive gas mixture: 80% Oxygen and 20% argon

Target material: Aluminium

Magnetic field strength in vicinity of anode: 40 kA/m

Magnetic field strength in vicinity of target surface: 12 kA/m

Figure 2A:
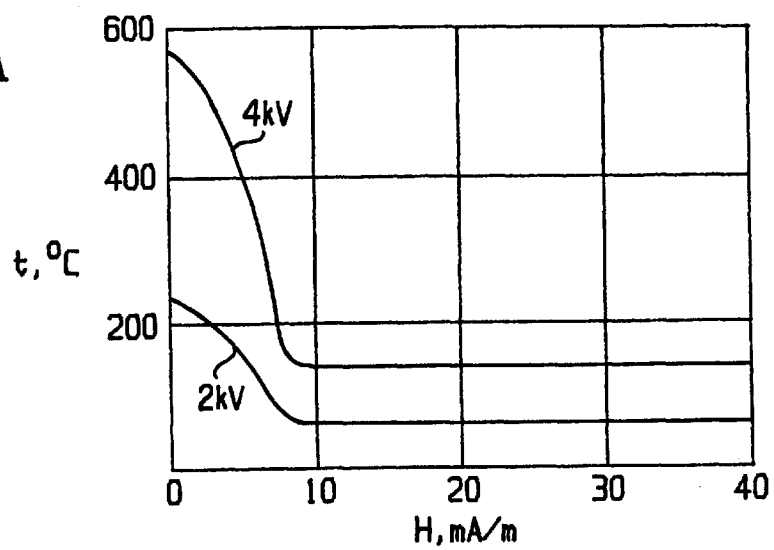
FIGS. 2a,b,c show the the operating characteristics of the sputtering deposition method according to the present invention in comparison with sputtering in a planar diode source.

With reference to non-limiting Eample 2 and FIGS. 2a,b,c it can now be explained how substrate temperature, reactive gas pressure and deposition rate depend on magnetic strength in the vicinity of the target, established during sputtering and configured in accordance with the present invention.

EXAMPLE 2

Sputtering Conditions:

Water cooled cathode, made of stainless steel, provided with Al target, having square configuration 100×300 mm Anode-cathode distance 60 mm Reactive gas: mixture of 80% argon with 20% oxygen Supplied voltage: 4 kV or 2 kV Supplied power: 1.2 kW and 0.2 kW respectively Resulting coating: Alumina As it can be easily seen in FIG. 2a, sputtering with magnetic focusing is always accompanied by reduction in substrate temperature t and after establishing of magnetic strength H of app. 10 kA/m the temperature has been reduced from 580/220 deg.C. down to 130/50 deg.C. for supplied voltage 4/2 kV respectively.

Figure 2B:
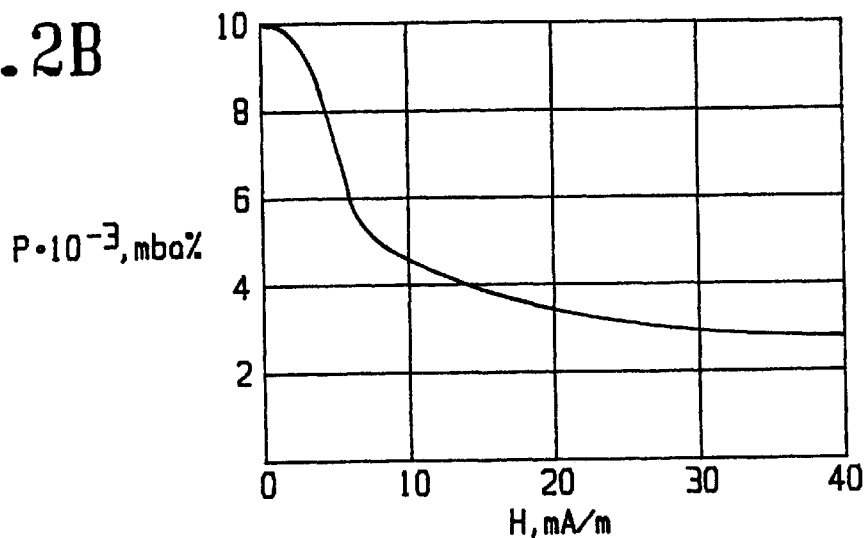

FIG. 2b shows that when a magnetic field with the strength of at least 10 kA/m is applied in the vicinity of the target surface and the supplied voltage is 4 kV, the working pressure of reactive gas atmosphere reduces from 0,01 mbars (1 Pa) to app. 0.005 mbars (0.5 Pa) without interruption of glow discharge between cathode and anode and termination of sputtering.

Figure 2C:
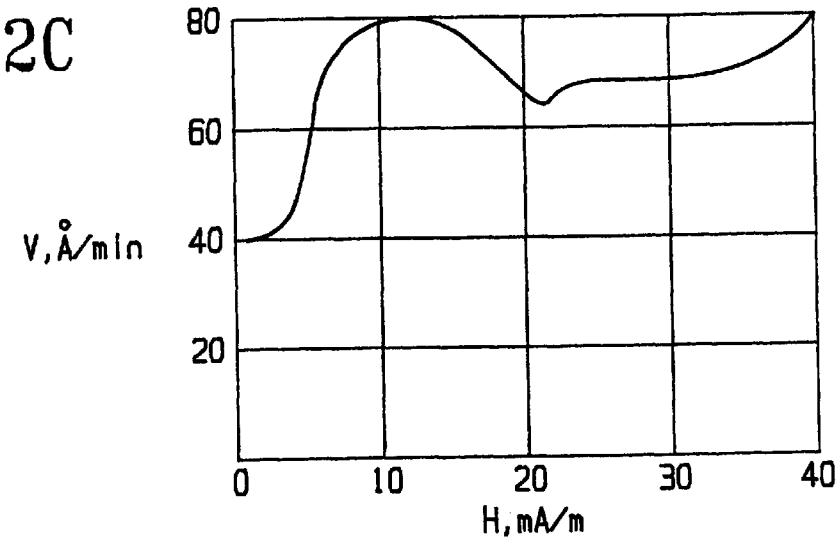

FIG. 2c demonstrates that deposition rate V can be advantageously accelerated after establishing within the apparatus of magnetic field with magnetic strength H of at least 10 kA/m. from 40 angstrom per minute up to 80 angstrom per minute. Table 1 below summarizes the optimal deposition rates, achieved for other oxide coatings, advan tageously deposited at above conditions in sputtering apparatus, provided with the target surface, made of appropriate metal.

TABLE 1

| coating composition | deposition rate angstrom/min |
|---|---|
| $SiO_2$ | 50 |
| $SnO_2$ | 170 |
| $Ta_2O_5$ | 80 |

Figure 3A:
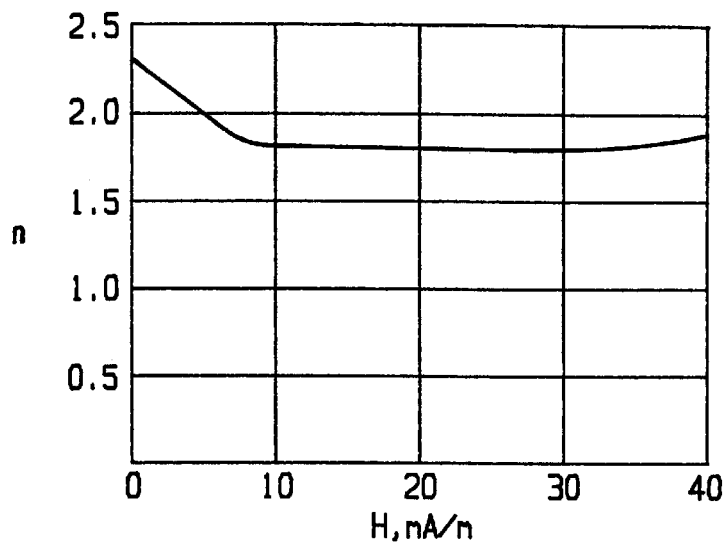
FIGS. 3a,b show properties of the coatings, deposited by the sputtering method according to present invention.

Now with reference to FIGS. 3a,b,c it will be shown how sufficient reduction of substrate temperatures, developing during sputtering deposition carried out in accordance with the present invention results in deposition of coatings with improved physical properties in general and optical properties in particular. This positive effect might be attributed to favorable conditions associated with formation of the coating, seeing that reduction of deposition temperature directly and indirectly influences coating properties and adhesion of the coating to the substrate.

In FIG. 3a it is shown how refraction index n of the $Ta_2O_5$ coating, deposited in accordance with the above conditions, diminishes, depending on magnetic field strength H within the cathode glow area. It can be seen that transparent amorphous coating with low refraction index was obtained.

Figure 3B:
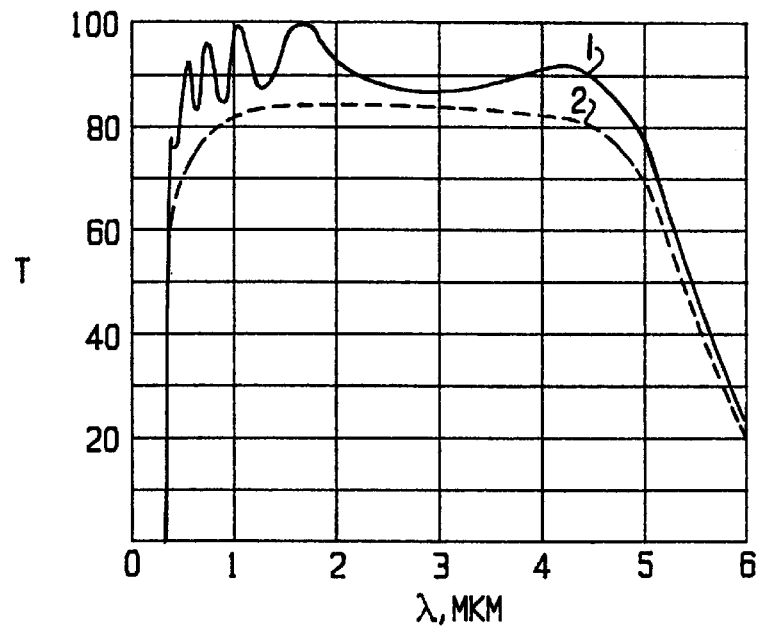

FIG. 3b presents results of transmittance measurements, carried out in accordance with the ASTM F 768-82 on 6 mm-thick glass plates, and coated on both sides by a 0.8 $\mu$m-thick silica coating, deposited by sputtering deposition method in accordance with the present invention. Transmittance T is shown by solid lines for coated glass and by dotted lines for uncoated glass. It can be clearly seen that transmittance of glass with silica coating is improved, as compared with uncoated glass. Transmittance has a uniform value of at least 85% in the wide range of wavelengths 0.3–6 $\mu$m.

Figure 3C:
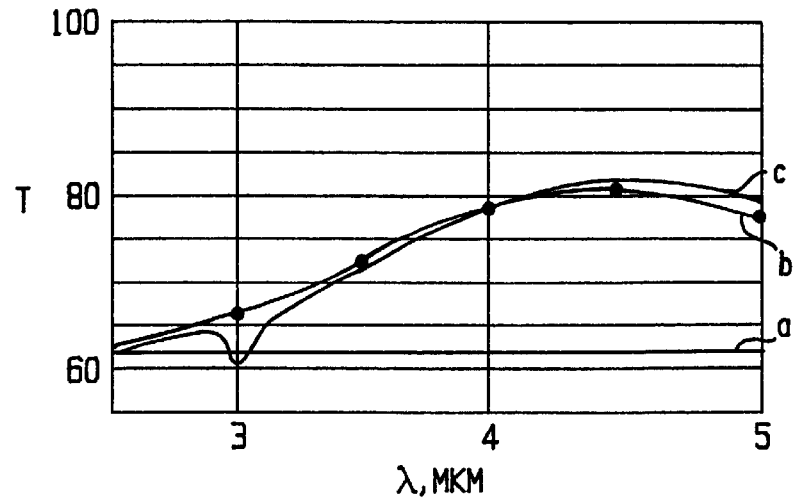

FIG. 3c shows transmittance T in the range of near IR—middle IR spectrum for pure silicon, taken as a reference (curve a), for silicon, coated by a 0.8 $\mu$m-thick layer of silica, deposited by sputtering deposition method in accordance with the present invention (curve b) and by convenient electron beam deposition method (curve c). It can be clearly seen, that at the wave length of app 0.3 $\mu$m, the curve c exhibits sharp reduction of transmittance up to a certain minimum. This phenomena is explained by absorbtion of light due to the presence of water, absorbed by the coating, and indicating, that the structure of the coating deposited by convenient electron beam deposition method, is porous.

In contrast to the above, the transmittance curve, obtained for a coating deposited by the present sputtering deposition method (curve b) does not exhibit such a minimum and this might be attributed to the formation of a coating with more homogeneous and dense structure.

It has also been established that besides improving optical properties and density, the coatings deposited by the present sputtering deposition method possess good chemical resistance.

Non-limiting Eample 3 below describes conditions, used for sputtering deposition of such a coating.

EXAMPLE 3

Water cooled cathode with diameter 60 mm.
Supplied negative voltage: 2 kV
Discharge current: 300 mA
Reactive gas mixture: 80% Oxygen, 20% Argon
Working pressure: 0,004 mbar
Target material: Si
Substrate material: Kronglass
Magnetic field strength in vicinity of anode: 40 kA/m
Magnetic field strength in vicinity of target surface: 12 kA/m
Resulting coating: $SiO_2$ For evaluation of chemical resistance the coated and uncoated glass samples were exposed to 80% solution of sulfuric acid at 80 deg.C. for 8 hours and concentration of certain elements was measured before and after exposure within the sample. The uncoated samples were made of Kronglass. A 0.4 $\mu$km-thick $SiO_2$ coating was deposited on both sides of the sample.

Si, Na and K concentrations were measured using the EDS method within the 4 $\mu$m-thick surface layer, including the coating.

Table 2 below summarizes the chemical composition of a surface layer, as measured for coated and uncoated samples before and after exposure, as well as the relative change of the surface layer composition (in percents).

As can be clearly seen, sputtering deposition of silica coating on Kronglass resulted in much less variation of the surface layer composition, associated with very slow chemical interaction during exposure. This phenomena can be explained by firm adhesion of the coating and its good chemical resistance.

The possibility of depositing dense coatings with improved properties, good chemical resistance and without excessive heating of the substrate may be advantageous for many kinds of articles, including cemented carbide cutting tools, ceramics, etc. However,

TABLE 2

| | Uncoated sample | | | Coated sample | | |
|---|---|---|---|---|---|---|
| Element | before exposure | after exposure | relative change | before exposure | after exposure | relative change |
| Si | 39.9 | 38.2 | −4.3 | 45.7 | 45.6 | −0.2 |
| Na | 2.6 | 3.5 | 34.6 | 1.8 | 1.6 | −11.1 |
| K | 57.5 | 58.3 | 1.4 | 52.5 | 52.8 | 0.6 | it is of particular importance for such articles like glass or steel molds for manufacturing of optical articles, plastic optical lenses and the like.

Figure 4A:
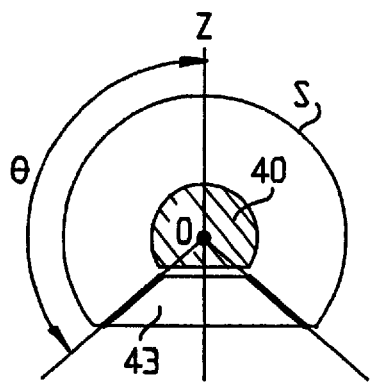
FIGS. 4a,b,c show schematically the relative disposition of cathode, anode and substrate holding means, employed in the apparatus, according to the present invention and suitable for simultaneous sputtering of a coating on a plurality of substrates.
Figure 4B:
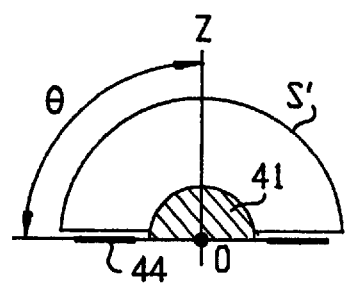
Figure 4C:
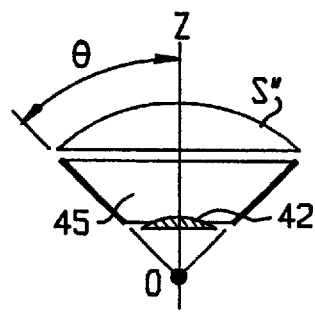

These articles are mass produced and here the possibility of obtaining a coating with uniform thickness and isotropic properties on plurality of articles is critical. The known magnetron sources, suitable for coating of plurality of articles during the same run, employ various types of substrate motion relative to the target. This is inevitably associated with the complicated design of the substrating holding means and the inefficient utilization of working space within the chamber. With reference to FIGS. 4a,b,c and 5 it will now be explained how the present sputtering deposition method and apparatus provide for most advantageous conditions in terms of homogeneity of target erosion and uniformity of the coating obtained on plurality of substrates without their movement. A plurality of articles are situated on the substrate holding means so as to face the cathode pole structure and to be exposed to the sputtering material, originating from its outwardly facing target surface 40,41,42. In order to enable sputtering of a plurality of substrates the outwardly facing target surface is configured as a spherical segment with center O. The articles are arranged on the substrate holding means in such a manner that they become in a vis-a-vis disposition with respect to the target surface within a spherical space region S,S',S", which is equidistant with the target surface. The anode 80,81,82 is formed as a body, having axis of rotation Z, passing through center O. The anode surface is configured as a truncated cone 80 (FIG. 4a), or a disc 81 (FIG. 4b), or an inverted truncated cone 82 (FIG. 4c). It should be understood that in all these embodiments the anode surrounds the cathode pole structure and the disposition of plurality of articles within a spherical space region S,S',S" can be defined by a declination angle θ, confined between the axis Z and the anode.

It might be particularly advantageous if the anode surface is disposed with respect to the cathode pole structure in such a manner that its imaginable apex (truncated cone configuration) or its center (disc configuration) coincides with the center O of the spherical target surface 40,41,42.

By virtue of the nonuniform magnetic field configured in accordance with the above defined parameters, there is no formation of locally eroded regions on the target surface and therefore the flux of material ejected from the target and directed toward the substrate is kept homogeneous.

It has been empirically established that provision of homogeneously eroding target in combination with above described configuration and disposition of target surface, anode surface and substrate holding means enables deposition of uniform coatings on a plurality of substrates, arranged within spherical space region, having a wide declination angle. $0° \leq \theta \leq 150°$, which allows utilization of the working space in a most efficient way.

Figure 6:
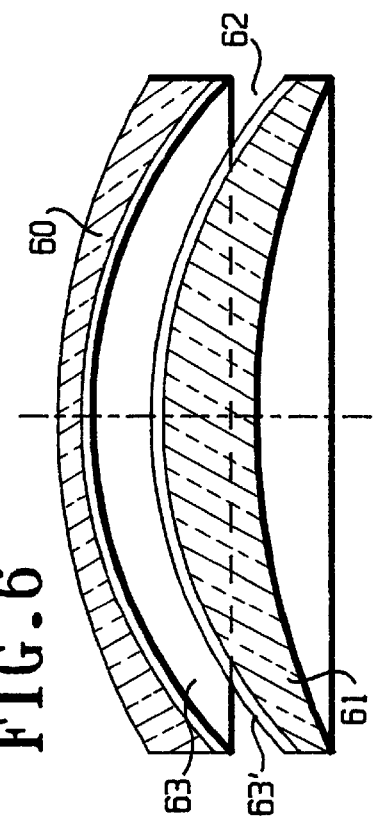
FIG. 6 shows an example of an article of manufacture, provided with a coating in accordance with the present invention.
Figure 5:
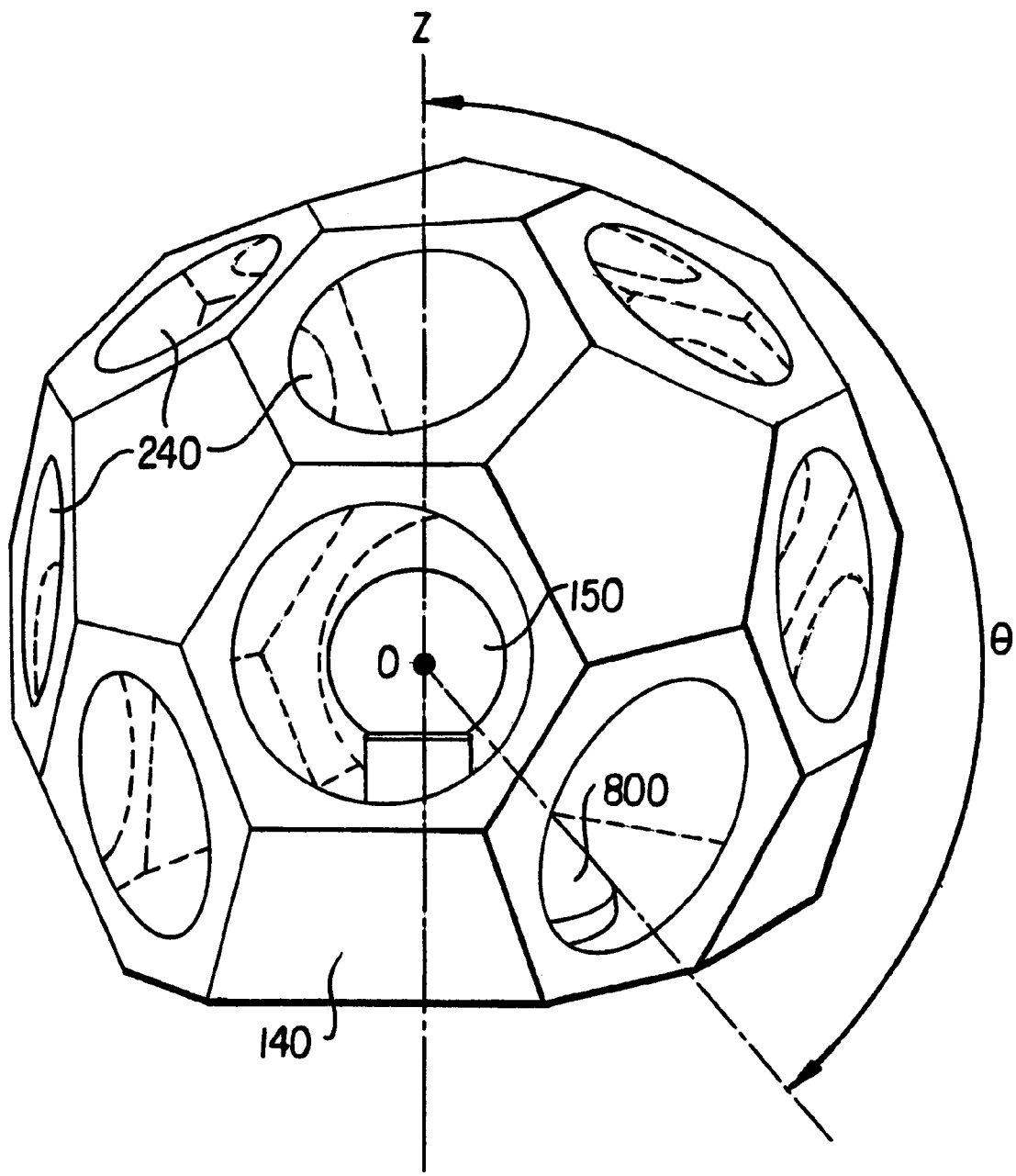
FIG. 5 is an isometrical view of one of the embodiments of a substrate holding means used for simultaneous sputtering of a coating on a plurality of substrates.

Now, with reference to FIGS. 5, 6, particular implementation of the present invention for sputtering deposition of an uniform coating on a plurality of articles, will be described in more detail. The cathode pole structure is formed as a body, having central symmetry and is provided with a target, having an outwardly facing surface, formed as spherical segment 150 with center O. An anode is formed as a truncated cone 800 and is mounted with respect to cathode pole structure in such a manner that its axis of symmetry Z coincide with the center O of the target surface. The substrate holding means 140 is formed as a thin walled stainless steel structure, having the configuration of a truncated icosahedron, situated in such a manner that its inwardly facing surface faces the outwardly facing target surface and defines a space region, surrounding the target surface within an inclination angle θ confined between axis Z and conical anode. Those faces of the icosahedron structure, which have 6 edges constitute a plurality of holding stations 240 for fixation thereon a plurality of substrates. It is advantageous if the target surface 150 and substrate holding means 140 constitute bodies with central symmetry, while anode 800 constitutes a body with rotational symmetry along axis Z. In accordance with the present invention the substrate holding means is disposed with respect to target surface in such a manner, that centers of symmetry of target surface 150 and substrate holding means 140 coincide and lie on axis Z. By virtue of this disposition an uniform coating is obtained during the same run on a plurality of substrates, occupying a plurality of holding stations.

It should be understood that the substrate holding means can be formed not only as an icosahedron, but also as a dodecahedron, octahedron or other body, defined by its center of symmetry, providing that it has enough faces for disposing thereon a plurality of articles to be coated. In order to increase the output the apparatus can be equipped with several cathode pole structures and/or substrate holding means.

Despite the present invention being suitable for the deposition of coatings on different articles, it might be especially advantageous to implement the present invention for the deposition of a coating on a plurality of such articles like molds for the manufacture of plastic optical lenses. A pair of such molds 60,61, constituting a set is shown in FIG. 6. The lens is produced by pouring a monomer liquid into the space 62, defined between concave/convex working surfaces 63,63' of molds and then by sealing the space and polymerization of the monomer therein.

The molds are made of glass and their performance in terms of service life is influenced inter alia by working surface structure and by its chemical resistance.

Figure 7:
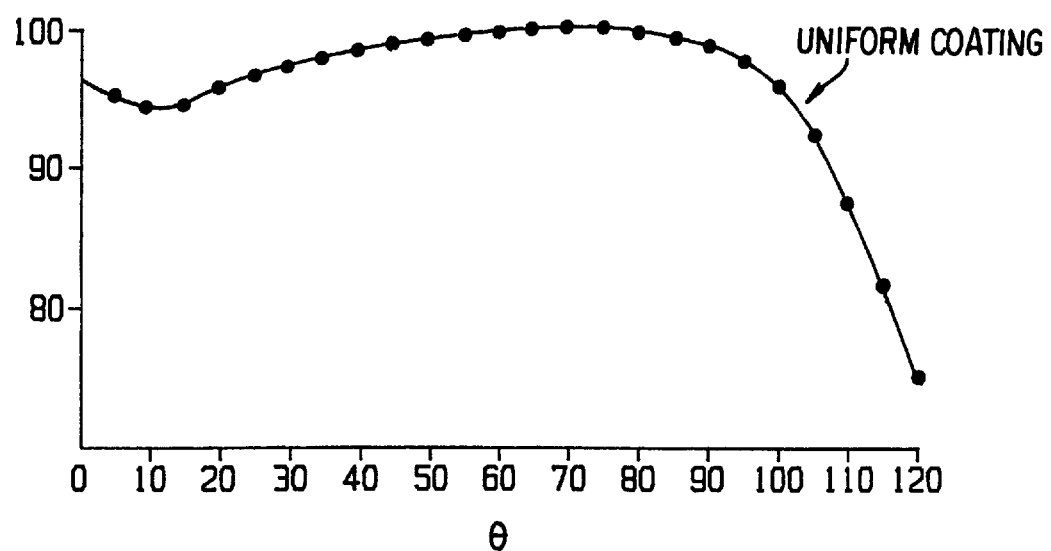
FIG. 7 shows the distribution of the thickness of coatings, deposited on a plurality of articles, shown in FIG. 6 and fixed in the substrate holding means, shown in FIG. 5.

It has been already shown, that deposition of $SiO_2$ coating on Kronglass results in improvement of chemical resistance of the surface layer. This fact was successfully implemented for coating of molds, made of Kronglass. The deposition was carried out in accordance with the sputtering conditions, described in Eample 3 within the apparatus, equipped with spherical target and icosahedron holding means, as shown in FIG. 5. FIG. 7 illustrates deviation D of the coating thickness in % of nominal thickness as a function of the location of the mold within the chamber, expressed as a declination angle θ. It can be seen that deviation of the thickness did not exceed several percents within wide range of declination angle θ from app. 10 up to 100 degrees.

The present invention should not be limited to the above preferred embodiments and it should be understood that changes and modifications can be made by one ordinarily skilled in the art, without deviation of the scope of the invention, as will be defined below in the appended claims.

What is claimed is:

1. A method of depositing a coating onto a substrate by means of a sputtering process, wherein a glow discharge plasma is generated in a diode sputtering source between a cathode, provided with an outwardly facing surface constituting a target, and an anode, and wherein generation of said plasma results in ion bombardment of said target followed by ejection of target material and movement of said target material toward said substrate with subsequent formation of a coating deposited onto said substrate, said method comprising the steps of:
  i) introducing a substrate into a process chamber so as to expose a surface of said substrate to flux of the sputtered target material;
  ii) establishing a magnetic field within said chamber;
  iii) applying, to said cathode, electrical, power sufficient for establishing a glow discharge;
  iv) establishing, within said chamber, an atmosphere of ionizable fluid continuously fed thereinto and evacuated therefrom so as to establish a uniform working pressure within said chamber; and
  v) maintaining, between said anode and said cathode, a self-sustained glow discharge accompanied by generation of a plasma consisting of ions of an ionizable fluid for bombarding said target and emitting target material toward said substrate;
  wherein said diode sputtering source is a high voltage discharge diode source with an applied arbitrary, directed, stationary magnetic field and wherein said field is varied in such a manner that there is established a gradient of magnetic field strength directed from said anode to said target, and wherein the magnetic strength of said magnetic field within a first region situated adjacent to said anode exceeds a magnetic field strength within a second region situated adjacent to said target by at least 25%, and said second region has a configuration of a layer, said layer extending above and along said outwardly facing target surface, and wherein said magnetic field is configured so as to localize and shift said plasma away from said substrate.

2. A method as defined in claim 1, further including the step of supplying electrical power to said diode sputtering source so as to supply said diode spattering source with a source voltage in the range of from about 1.5 to about 5 kV, said magnetic field being established by means of permanent magnets.

3. A method as defined in claim 1, wherein said ionizable fluid consists of an inert gas.

4. A method as defined in claim 1, wherein said working pressure of said ionizable fluid is maintained in the range of from about 0.1 to about 0.7 Pa.

5. A method as defined in claim 1, wherein said ionizable fluid consists of an inert and a reactive gas.

6. A method as defined in claim 1, further including the step of controlling the anode-to-cathode potential to accelerate electrons and ions of plasma to effect imparting to dislodged particles sufficient energy to move them towards the substrate.

7. A method as defined in claim 1, wherein the process chamber comprises a single chamber, further including the step of substantially uniformly maintaining the pressure inside said single process chamber at about 3.7 mtorr after application of the magnetic field.

8. A method as defined in claim 1, wherein the magnetic field strength gradient from the anode to the target ranges from about 10 to about 100 kA/m in the vicinity of the anode and from about 8 to about 10 kA/m in the immediate vicinity of the target.

9. A method as defined in claim 1, wherein the electrical power is supplied by means of a supply voltage.

10. A method as defined in claim 1, wherein the electrical power is supplied by means of an ac supply voltage.

11. A method as defined in claim 1, wherein the magnetic field is established by means of solenoid electromagnets.

12. A method as defined in claim 1, wherein the magnetic strength of said magnetic field within said first region situated adjacent to said anode exceeds the magnetic field strength within said second region situated adjacent to said target by 25% to 900%.

13. A method as defined in claim 12, wherein the magnetic strength of said magnetic field within said first region situated adjacent to said anode exceeds the magnetic field strength within said second region situated adjacent to said target by 25% to 450%.

* * * * *